United States Patent
Oh et al.

(10) Patent No.: US 9,323,291 B2
(45) Date of Patent: Apr. 26, 2016

(54) FLEXIBLE DISPLAY DEVICE

(71) Applicant: SAMSUNG DISPLAY CO., LTD., Yongin, Gyeonggi-Do (KR)

(72) Inventors: Woo-Jin Oh, Yongin (KR); Yang-Wan Kim, Yongin (KR)

(73) Assignee: SAMSUNG DISPLAY CO., LTD., Yongin, Gyeonggi-Do (KR)

(*) Notice: Subject to any disclaimer, the term of this patent is extended or adjusted under 35 U.S.C. 154(b) by 252 days.

(21) Appl. No.: 14/013,396

(22) Filed: Aug. 29, 2013

(65) Prior Publication Data

US 2014/0301044 A1    Oct. 9, 2014

(30) Foreign Application Priority Data

Apr. 3, 2013    (KR) .................... 10-2013-0036350

(51) Int. Cl.
| | |
|---|---|
| H05K 7/02 | (2006.01) |
| H05K 1/18 | (2006.01) |
| G02F 1/1333 | (2006.01) |
| G02F 1/1345 | (2006.01) |
| G06F 1/16 | (2006.01) |
| H01L 51/00 | (2006.01) |
| H01L 27/32 | (2006.01) |

(52) U.S. Cl.
CPC ............ *G06F 1/1652* (2013.01); *G06F 1/1637* (2013.01); *H01L 27/3276* (2013.01); *H01L 51/0097* (2013.01); *G02F 1/133305* (2013.01); *Y02E 10/549* (2013.01)

(58) Field of Classification Search
CPC .... H05K 7/02; H05K 1/187; G02F 1/133305; G02F 1/13452
See application file for complete search history.

(56) References Cited

U.S. PATENT DOCUMENTS

| | | | |
|---|---|---|---|
| 7,646,466 B2* | 1/2010 | Hashimoto | 349/158 |
| 7,999,904 B2* | 8/2011 | Tseng et al. | 349/158 |
| 8,243,053 B2* | 8/2012 | Wang et al. | 345/205 |
| 8,310,748 B2* | 11/2012 | Chan et al. | 359/296 |
| 8,395,746 B2* | 3/2013 | Hosoya | G02F 1/1345 349/149 |
| 8,982,575 B2* | 3/2015 | Lai et al. | 361/771 |
| 2008/0094561 A1* | 4/2008 | Fan et al. | 349/151 |
| 2009/0109369 A1* | 4/2009 | Morishita | 349/58 |
| 2009/0115942 A1* | 5/2009 | Watanabe | 349/96 |
| 2009/0185339 A1* | 7/2009 | Kwon et al. | 361/679.21 |
| 2009/0310314 A1* | 12/2009 | Shinn et al. | 361/749 |
| 2012/0050988 A1* | 3/2012 | Rothkopf et al. | 361/688 |
| 2013/0328051 A1* | 12/2013 | Franklin et al. | 257/59 |

FOREIGN PATENT DOCUMENTS

| | | | | |
|---|---|---|---|---|
| JP | 0607453 A1 * | 7/1994 | | F21S 9/02 |
| JP | 2010-0202729 A | 9/2010 | | |
| KR | 10-2007-0093338 A | 9/2007 | | |
| KR | 10-2009-0121894 A | 11/2009 | | |

* cited by examiner

*Primary Examiner* — Jeremy C Norris
*Assistant Examiner* — Nathan Milakovich
(74) *Attorney, Agent, or Firm* — Lee & Morse, P.C.

(57) ABSTRACT

A flexible display device including a display area for displaying an image and a non-display area neighboring the display area includes: a flexible substrate including a plurality of chamfers on respective ends corresponding to the non-display area; a display provided on the flexible substrate corresponding to the display area and displaying the image; and a driver provided on the flexible substrate corresponding to the non-display area and connected to the display.

16 Claims, 4 Drawing Sheets

FLEXIBLE DISPLAY DEVICE

CROSS-REFERENCE TO RELATED APPLICATION

Korean Patent Application No. 10-2013-0036350, filed on Apr. 3, 2013, in the Korean Intellectual Property Office, and entitled: "Flexible Display Device," is incorporated by reference herein in its entirety.

BACKGROUND

1. Field

The described technology relates generally to a flexible display device. More particularly, the described technology relates generally to a flexible display device including a flexible substrate.

2. Description of the Related Art

Organic light emitting diode displays have recently been in the spotlight. Organic light emitting diode displays are self-luminescent, not requiring a separate light source, unlike a liquid crystal display (LCD) device, and thus can have reduced thickness and weight. Further, organic light emitting diode displays provide low power consumption, high luminance, and high reaction speed.

In general, the organic light emitting diode display includes a substrate, an insulation layer provided on the substrate, an organic light emitting diode provided on the insulation layer, and an encapsulator sealing the organic light emitting diode together with the substrate. Recently, a flexible display device including a flexible substrate made of an organic material has been developed.

The above information disclosed in this Background section is only for enhancement of understanding of the background of the described technology and therefore it may contain information that does not form the prior art that is already known in this country to a person of ordinary skill in the art.

SUMMARY

Embodiments are directed to a flexible display device including a display area for displaying an image and a non-display area neighboring the display area, the flexible display device including a flexible substrate including a plurality of chamfers on respective ends corresponding to the non-display area, a display on the flexible substrate corresponding to the display area and displaying the image, and a driver on the flexible substrate corresponding to the non-display area and connected to the display.

The driver may be provided between neighboring chamfers.

The flexible substrate may include a flexible substrate main body and an insulation layer provided on the flexible substrate main body, and at least the insulation layer from among the flexible substrate main body and the insulation layer may form the chamfer.

The flexible substrate main body includes an organic material, and the insulation layer includes an inorganic material.

The chamfer may be an edge of the flexible substrate main body and the insulation layer.

The chamfer may be in the insulation layer, and the chamfer may expose the flexible substrate main body.

The chamfer may be a groove.

The flexible display device may include an encapsulator corresponding to the display area, the encapsulator sealing the display together with the flexible substrate. The display may include an organic light emitting diode.

The flexible display device may include a window on the display, the window covering the display area and the non-display area.

An edge of the window neighboring the chamfer of the flexible substrate may be curved.

Embodiments are directed to a flexible display device including a flexible display device including a display area for displaying an image and a non-display area neighboring the display area, the flexible display device including a flexible substrate including a first bevel on a first end of the flexible substrate corresponding to the non-display area and a second bevel on a second end of the flexible substrate corresponding to the non-display area, a display on the flexible substrate corresponding to the display area and displaying the image, and a driver on the flexible substrate corresponding to the non-display area and connected to the display.

The flexible substrate may include a flexible substrate main body and an insulation layer provided on the flexible substrate main body, and the first and second bevels isolate an insulation layer on an outer portion of the flexible substrate main body from an insulation layer on a portion of the flexible substrate main body having the driver thereon.

The first and second bevels may be in the insulation layer, and the first and second bevels may expose the flexible substrate main body.

The flexible substrate may include a flexible substrate main body and an insulation layer provided on the flexible substrate main body, and the first and second bevels are edges of the flexible substrate main body and the insulation layer.

The display may include an organic light emitting diode.

The flexible display device may include a window on the display, the window covering the display area and the non-display area.

An edge of the window neighboring the first and second bevels of the flexible substrate may be curved.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
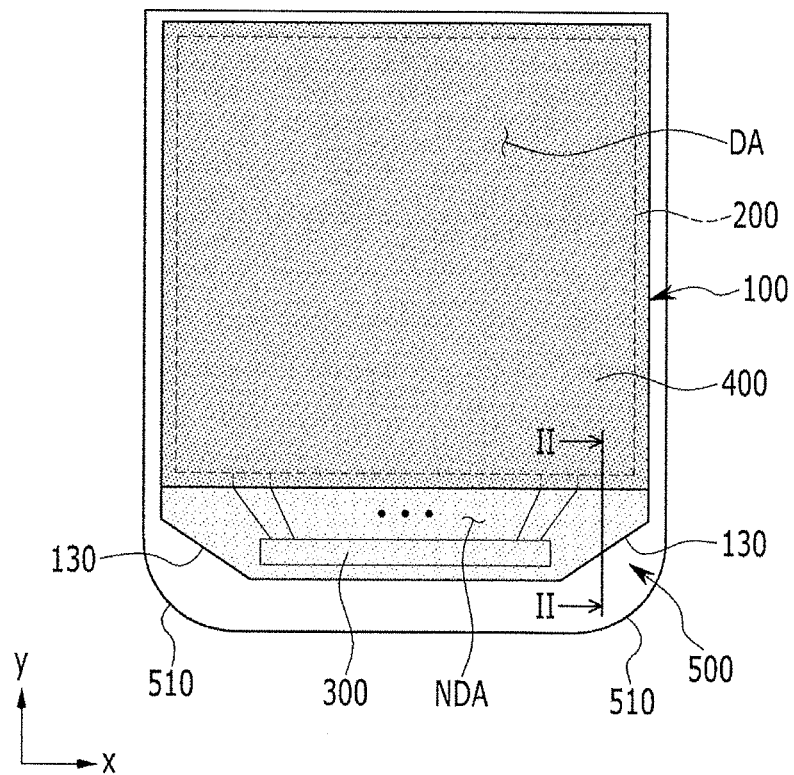
FIG. 1 illustrates a top plan view of a flexible display device according to a first exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Accordingly, the drawings and description are to be regarded as illustrative in nature and not restrictive, and like reference numerals designate like elements throughout the specification.

Further, in the embodiments, like reference numerals designate like elements throughout the specification representatively in a first embodiment, and only elements of embodiments other than those of the first embodiment will be subsequently described.

In addition, the size and thickness of each component shown in the drawings are arbitrarily shown for better understanding and ease of description, but the embodiments are not limited thereto.

In the drawings, the thickness of layers, films, panels, regions, etc., are exaggerated for clarity. For better understanding and ease of description, the thicknesses of some layers and areas are exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Further, throughout the specification, "on" implies being positioned above or below a target element, and does not imply being necessarily positioned on the top on the basis of a gravity direction.

A flexible display device according to a first exemplary embodiment will now be described with reference to FIG. 1 and FIG. 2. The display for displaying an image discussed below includes an organic light emitting diode. Alternatively, the display may include liquid crystal, plasma, electronic ink, and so forth, as applicable to a flexible display.

FIG. 1 illustrates a top plan view of a flexible display device according to a first exemplary embodiment. FIG. 2 shows a cross-sectional view with respect to a line II-II of FIG. 1.

Figure 2:
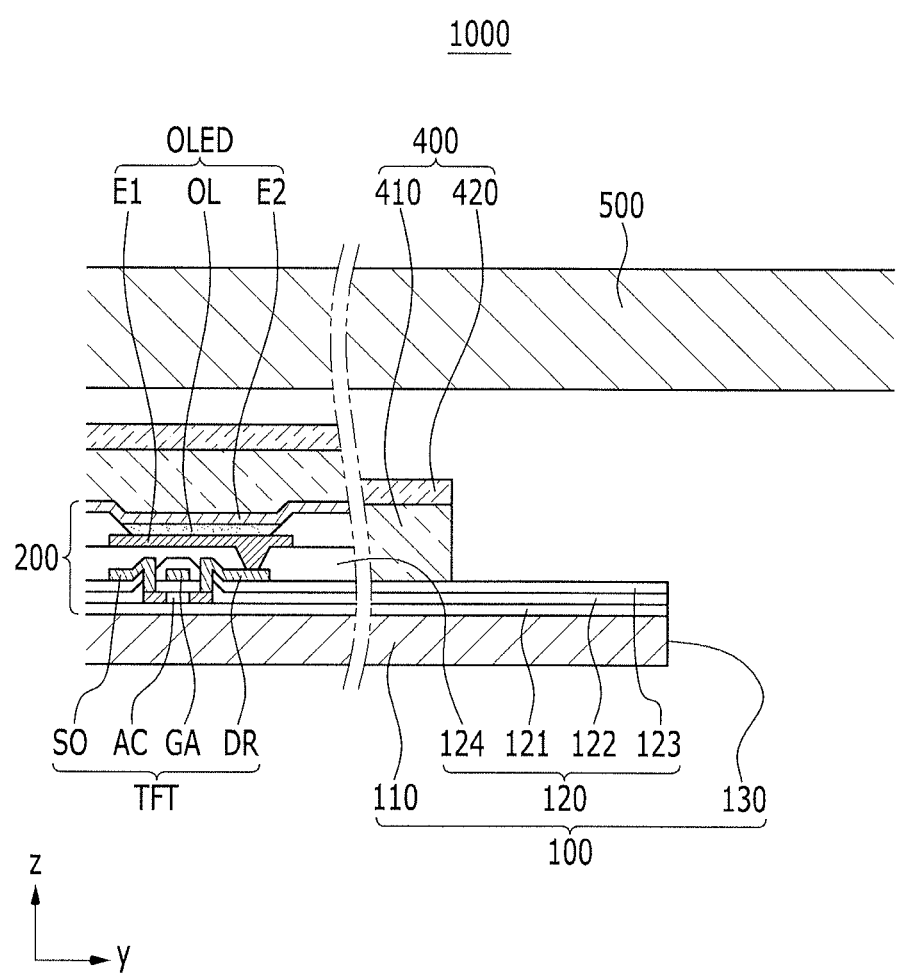
FIG. 2 illustrates a cross-sectional view with respect to a line II-II of FIG. 1.

As shown in FIG. 1 and FIG. 2, the flexible display device 1000 includes a display area (DA) for displaying an image and a non-display area (NDA) neighboring the display area (DA). The flexible display device 1000 also includes a flexible substrate 100, a display 200, a driver 300, an encapsulator 400, and a window 500.

The flexible substrate 100 may have a shape corresponding to the display area (DA) and the non-display area (NDA), e.g., a plate shape, and may include a flexible substrate main body 110, a insulation layer 120, and a chamfer 130.

The flexible substrate main body 110 may include an organic material including at least one of polyethylene terephthalate, a polyimide, a polycarbonate, an epoxy, polyethylene, and a polyacrylate. The flexible substrate main body 110 may include a polyimide from among the organic material. The flexible substrate main body 110 is flexible and transmissive.

The insulation layer 120 may be formed on the flexible substrate main body 110, and may include a first inorganic layer 121, a second inorganic layer 122, a third inorganic layer 123, and an organic layer 124. The first inorganic layer 121, the second inorganic layer 122, the third inorganic layer 123, and the organic layer 124 may be respectively formed when the display 200 is formed. The first inorganic layer 121, the second inorganic layer 122, and the third inorganic layer 123 may respectively include an inorganic material including a silicon nitride (SiNx), alumina ($Al_2O_3$), a silicon oxide (SiOx), and titanium oxide ($TiO_2$). The insulation layer 120 may be formed when the display 200 is formed, and a number of stacked layers may be varied according to the shape of the display 200. For example, the number of layers included in the insulation layer 120 can be 1 to 3, or more than 3.

A plurality of chamfers 130 may be respectively formed on respective ends of the flexible substrate 100 corresponding to the non-display area (NDA). Each chamfer 130 may be formed by incising respective edges of the flexible substrate having a quadrangular shape in an inclined manner with respect to a plane, as can be seen in FIG. 1. The chamfer 130 may be formed by incising the flexible substrate main body 110 and the insulation layer 120. In particular, the flexible substrate main body 110 and the insulation layer 120 may be incised along the z-axis, i.e., along an image output axis, at an angle to both the x- and y-axes, to form the chamfer 130.

The display 200 may be provided on the flexible substrate 100 corresponding to the display area (DA), and may include a driving circuit and an organic light emitting diode (OLED).

The driving circuit may include a driving thin film transistor (TFT) including a gate electrode (GA), a source electrode (SO), a drain electrode (DR), and an active layer (AC), and a switching thin film transistor connected to the gate electrode (GA) of the driving thin film transistor (TFT). For better understanding and ease of description, the switching thin film transistor is not shown, and the entire shape of the driving circuit may be varied in accordance with known configurations.

The organic light emitting diode (OLED) may include a first electrode (E1) connected to the drain electrode (DR) of the driving thin film transistor (TFT), an organic emission layer (OL) on the first electrode (E1), and a second electrode (E2) on the organic emission layer (OL). The organic light emitting diode (OLED) is a self-luminance diode, and uses light emitted therefrom to display the image. The entire shape of the organic light emitting diode (OLED) may be varied in accordance with known configurations.

The driver 300 may be provided on the flexible substrate 100 corresponding to the non-display area (NDA) and is connected to the display 200. The driver 300 may be provided between neighboring chamfers 130 and can have a chip on film (COF) form. The driver 300 may receive a driving signal from a printed circuit board (PCB) connected to the driver 300 and may supply the driving signal to the driving circuit of the display 200. The driving signal supplied to the driving circuit through the driver 300 may be supplied to the first electrode (E1) of the organic light emitting diode (OLED) through the driving circuit. The organic emission layer (OL) emits light in accordance with the driving signal supplied to the first electrode (E1) and a common signal supplied to the second electrode (E2).

The encapsulator 400 seals the display 200 together with the flexible substrate 100. The encapsulator 400 may include an organic encapsulation layer 410 and an inorganic encapsulation layer 420.

The organic encapsulation layer 410 may be formed of polymers, e.g., may be a single layer or a deposition layer including one of polyethylene terephthalate, a polyimide, a polycarbonate, an epoxy, polyethylene, and a polyacrylate. The organic encapsulation layer 410 may be be formed with a polyacrylate, e.g., may include a polymerized monomer composition including a di-acrylate monomer and a tri-acrylate monomer.

The inorganic encapsulation layer 420 may be provided on the organic encapsulation layer 410 and may be a single layer or a stacked layer including a metal oxide or a metal nitride. For example, the inorganic encapsulation layer 420 may include at least one of a silicon nitride (SiNx), alumina ($Al_2O_3$), a silicon oxide (SiOx), and titanium oxide ($TiO_2$).

The organic encapsulation layer 410 and the inorganic encapsulation layer 420 may be formed with a plurality of layers, respectively. The inorganic encapsulation layer 420 for preventing permeation of moisture may be provided at the highest layer of the encapsulator 400 having with the organic encapsulation layers 410 and the inorganic encapsulation layers 420. The organic encapsulation layers 410 and the inorganic encapsulation layers 420 may be alternately stacked.

The window 500 may be provided on the display 200 and may cover the display area (DA) and the non-display area (NDA). In detail, the window 500 may be provided on the encapsulator 400. The window 500 may be formed, e.g., with glass or a transparent resin, and protects the flexible display device 1000 from an external impact. Respective edges 510 of the window 500 that neighbor the chamfer 130 may be curved, e.g., curved outwardly.

Regarding the flexible display device 1000 according to the first exemplary embodiment, the plate shaped flexible substrate included in the flexible display device 1000 is not formed as a quadrangle with four edges, but the chamfer 130 is formed at the respective ends corresponding to the non-display area (NDA) of the flexible substrate 100, thereby preventing interference with the window 500. Accordingly, interference of the flexible substrate 100 with other elements such as the window 500 is controlled so generation of cracks on the insulation layer 120 provided on the flexible substrate main body 110 may be controlled.

In detail, when the flexible substrate main body 110 includes a flexible organic material, the insulation layer 120 provided on the flexible substrate main body 110 may include a weak inorganic material. When the flexible substrate main body 110 is shaken, because of the chamfer 130 formed at the respective ends of the flexible substrate 100, generation of interference between the window 500 and the flexible substrate 100 is controlled and generation of cracks on the insulation layer 120 by the interference between the window 500 and the flexible substrate 100 is controlled.

Particularly, when the respective edges 510 of the window 500 are curved, a part of the flexible substrate 100 neighboring the respective edges 510 of the window 500 is formed as the chamfer 130, so that interference between the window 500 and the flexible substrate 100 does not occur.

Further, since generation of cracks at the insulation layer 120 of the flexible substrate 100 is controlled, damage to the driver 300 provided between the neighboring chamfers 130 by the crack generated on the insulation layer 120 may be controlled.

In addition, cracking of the insulation layer 120 is controlled, so shrinkage of the flexible substrate main body 110 by the crack generated on the insulation layer 120 is controlled.

That is, the flexible display device 1000 that controls damage caused by external interference is provided.

A flexible display device according to a second exemplary embodiment will now be described with reference to FIG. 3 and FIG. 4.

Distinctive features differing from the first exemplary embodiment will be described, and the omitted description follows that of the first exemplary embodiment. The second exemplary embodiment uses the same reference numerals for the same constituent elements as the first exemplary embodiment for better comprehension and ease of description.

Figure 3:
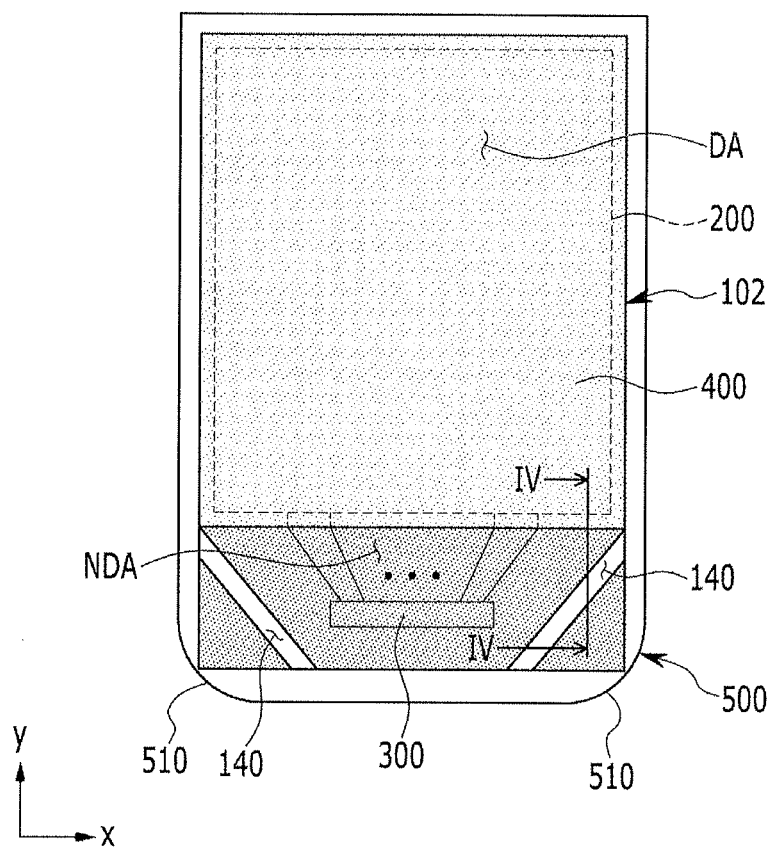
FIG. 3 illustrates a top plan view of a flexible display device according to a second exemplary embodiment.
Figure 4:
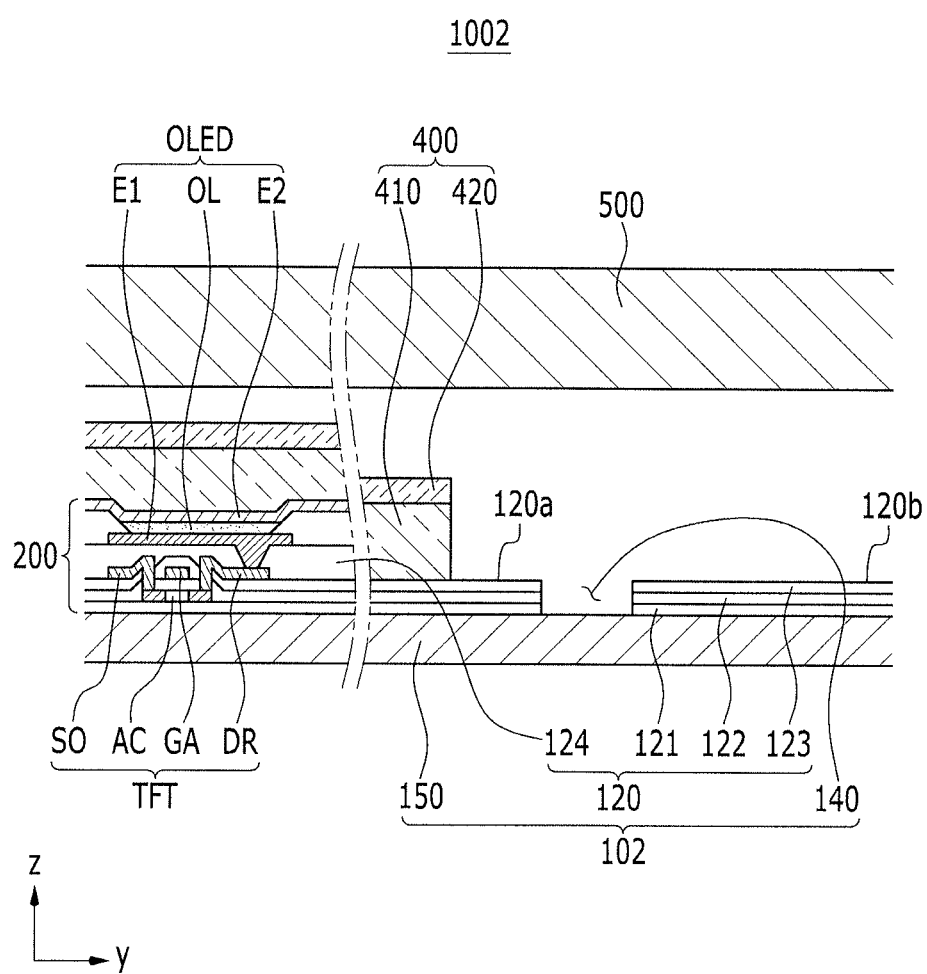
FIG. 4 illustrates a cross-sectional view with respect to a line IV-IV of FIG. 3.

FIG. 3 illustrates a top plan view of a flexible display device according to the second exemplary embodiment. FIG. 4 illustrates a cross-sectional view with respect to a line IV-IV of FIG. 3. As shown in FIG. 3 and FIG. 4, the insulation layer 120 forms a chamfer 140 of the flexible display device 1002. In other words, a flexible substrate main body 150 is not incised.

The flexible substrate main body 150 is formed as a quadrangle with four edges with respect to a plane, and the chamfer 140 formed by the insulation layer 120 has a groove shape to expose the flexible substrate main body 150. The chamfer 140 may be formed using a micro-electro-mechanical systems (MEMS) process, e.g., a photolithography process, and removing the insulation layer 120 corresponding to the chamfer 140 from the flexible substrate main body 150.

That is, a flexible substrate 102 may be formed as a quadrangle with four edges, and an insulation layer 120b provided at the two edges formed on the respective ends corresponding to the non-display area (NDA) is separated from the insulation layer 120a provided between the respective ends by the chamfer 140.

As described, regarding the flexible display device 1002, when the plate shaped flexible substrate main body 150 included in the flexible display device 1002 is formed as a quadrangle with four edges, the chamfer 140 is formed with a groove shape on the respective ends corresponding to the non-display area (NDA) of the flexible substrate 102 to remove the insulation layer 120 from a part that corresponds to the chamfer 140. Thus, when the window 500 generates interference with the edge of the flexible substrate main body 150, the stress caused by the interference is intercepted by the chamfer 140, is dissipated by the flexible substrate main body 150, and is not transmitted to the insulation layer 120 where the driver 300 is provided. Therefore, when the flexible substrate 102 generates interference with the window 500, generation of cracks on the insulation layer 120 provided in the center of the flexible substrate main body 150 is controlled.

In detail, when the flexible substrate main body 150 includes the flexible organic material, the insulation layer 120 provided on the flexible substrate main body 150 includes a weak inorganic material. When the flexible substrate main body 110 is shaken, because the chamfer 140 is formed on the respective ends of the flexible substrate 102, when interference between the window 500 and the flexible substrate 102 is generated, transmission of the stress generated at the respective edges to the insulation layer 120 provided in the center of the flexible substrate 102 is controlled. Thus, generation of cracks on the insulation layer 120 where the driver 300 is provided due to interference between the window 500 and the flexible substrate 102 is controlled.

The edge 510 of the window 500 may be curved, e.g., outwardly curved, so when the edge 510 of the adjacent window 500 generates interference with the edge of the flexible substrate 102, a part of the flexible substrate 102 neighboring the edge 510 of the window 500 is formed as the chamfer 140 in the groove shape from which the insulation layer 120 is removed, stress generated by interference in insulation layer 102b is intercepted by the chamfer 140 and is not transmitted to the center of the flexible substrate 102, i.e, to insulation layer 120a.

Further, since generation of cracks on the insulation layer 120 of the flexible substrate 102 where the driver 300 is provided is controlled, damage to the driver 300 provided between the neighboring chamfers 140 by the crack generated on the insulation layer 120 is controlled.

Also, cracking of the insulation layer 120 of the flexible display device 1002 is controlled so shrinkage of the flexible substrate main body 150 caused by the crack generated on the insulation layer 120 is controlled.

That is, the flexible display device 1002 that controls damage caused by external interference is provided.

By way of summation and review, one or more embodiments provide a flexible display device that controls damage caused by external interference. In particular, the insulation layer and/or the flexible substrate main body may be shaped, e.g., patterned or incised, in the non-display area to control stress generated from an external force from being transmitted to the display or driver.

In contrast, a conventional flexible substrate has a continuous quadrangular shape with four edges. These edges may interfere with other elements, e.g., a window that covers the flexible display device, resulting in cracking of an insulation layer formed on the flexible substrate, damaging the flexible display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details, e.g., bevels of a type other than chamfers, may be made without departing from the spirit and scope of the present invention as set forth in the following claims.

What is claimed is:

1. A flexible display device including a display area for displaying an image and a non-display area neighboring the display area, the flexible display device comprising:
   a flexible substrate including a plurality of chamfers on respective ends corresponding to the non-display area;
   a display on the flexible substrate corresponding to the display area and displaying the image; and
   a driver on the flexible substrate corresponding to the non-display area and connected to the display, wherein:
   the flexible substrate includes a flexible substrate main body and an insulation layer provided on the flexible substrate main body,
   at least the insulation layer from among the flexible substrate main body and the insulation layer forms each chamfer,
   each chamfer is in the insulation layer, and
   each chamfer exposes the flexible substrate main body.

2. The flexible display device as claimed in claim 1, wherein the driver is provided between neighboring chamfers.

3. The flexible display device as claimed in claim 1, wherein:
   the flexible substrate main body includes an organic material, and
   the insulation layer includes an inorganic material.

4. The flexible display device as claimed in claim 1, wherein each chamfer is an edge of the flexible substrate main body and the insulation layer.

5. The flexible display device as claimed in claim 1, wherein each chamfer is a groove.

6. The flexible display device as claimed in claim 1, further including an encapsulator corresponding to the display area, the encapsulator sealing the display together with the flexible substrate.

7. The flexible display device as claimed in claim 1, wherein the display includes an organic light emitting diode.

8. The flexible display device as claimed in claim 1, further including a window on the display, the window covering the display area and the non-display area.

9. The flexible display device as claimed in claim 8, wherein an edge of the window neighboring each chamfer of the flexible substrate is curved.

10. A flexible display device including a display area for displaying an image and a non-display area neighboring the display area, the flexible display device comprising:
    a flexible substrate including a first bevel on a first end of the flexible substrate corresponding to the non-display area and a second bevel on a second end of the flexible substrate corresponding to the non-display area;
    a display on the flexible substrate corresponding to the display area and displaying the image; and
    a driver on the flexible substrate corresponding to the non-display area and connected to the display, wherein:
    the flexible substrate includes a flexible substrate main body and an insulation layer provided on the flexible substrate main body, and
    the first and second bevels isolate a part the insulation layer on an outer portion of the flexible substrate main body from a part of insulation layer on a portion of the flexible substrate main body having the driver thereon.

11. The flexible display device as claimed in claim 10, wherein
    the first and second bevels are in the insulation layer, and
    the first and second bevels expose the flexible substrate main body.

12. The flexible display device as claimed in claim 10, wherein:
    the first and second bevels are edges of the flexible substrate main body and the insulation layer.

13. The flexible display device as claimed in claim 10, wherein the display includes an organic light emitting diode.

14. The flexible display device as claimed in claim 10, further including a window on the display, the window covering the display area and the non-display area.

15. The flexible display device as claimed in claim 14, wherein an edge of the window neighboring the first and second bevels of the flexible substrate is curved.

16. A flexible display device including a display area for displaying an image and a non-display area neighboring the display area, the flexible display device comprising:
    a flexible substrate including a first bevel on a first end of the flexible substrate corresponding to the non-display area and a second bevel on a second end of the flexible substrate corresponding to the non-display area;
    a display on the flexible substrate corresponding to the display area and displaying the image; and
    a driver on the flexible substrate corresponding to the non-display area and connected to the display, wherein:
    the flexible substrate includes a flexible substrate main body and an insulation layer provided on the flexible substrate main body,
    at least the insulation layer from among the flexible substrate main body and the insulation layer forms the first bevel and the second bevel,
    the first bevel and the second bevel are in the insulation layer, and
    the first bevel and the second bevel expose the flexible substrate main body.

* * * * *